United States Patent [19]

Minnick et al.

[11] Patent Number: 5,098,781
[45] Date of Patent: Mar. 24, 1992

[54] THERMOPLASTIC FILM, REINFORCED HOLLOW GLASS MICROSPHERE REINFORCED LAMINATES FOR THIN LOW DIELECTRIC CONSTANT SUBSTRATES

[75] Inventors: Michael G. Minnick; Rakesh Jain, both of Coshocton, Ohio

[73] Assignee: General Electric Company, Worthington, Ohio

[21] Appl. No.: 635,087

[22] Filed: Dec. 28, 1990

[51] Int. Cl.$^5$ .................. B32B 15/04; B32B 15/08;

[52] U.S. Cl. .................. 428/313.5; 428/313.3; 428/901; 428/246; 428/285; 428/313.9; 428/416

[58] Field of Search .................. 525/534; 428/313.3, 428/313.9, 313.7

[56] References Cited

U.S. PATENT DOCUMENTS 4,963,425  10/1990  Buchanan et al. .................. 428/901
5,049,435   9/1991  Uno et al. .................. 428/901

FOREIGN PATENT DOCUMENTS 61-00943  1/1986  Japan .

Primary Examiner—George F. Lesmes
Assistant Examiner—Richard C. Weisberger
Attorney, Agent, or Firm—Mueller and Smith

[57] ABSTRACT

The present invention is directed to a metal-clad electrical laminate which comprises a core of one or more of a polyetherimide thermoplastic, polyphenylene oxide thermoplastic, or a resinous-filled reinforced substrate. A pair of intermediate layers of hollow glass microsphere-filled polyphenylene oxide/epoxy is bound to either side of the core. Finally, a pair of metal foil layers are bound to the filled intermediate layers to produce the laminate of the present invention. The laminate desirably has a thickness of less than about 0.010 in., a dielectric constant of about 3 or less, and a HGM content in excess of about 10 wt-%. Additionally, the laminate has a softening point sufficiently high to avoid substantial distortion at processing temperatures of around 200°–235° C.

14 Claims, No Drawings

THERMOPLASTIC FILM, REINFORCED HOLLOW GLASS MICROSPHERE REINFORCED LAMINATES FOR THIN LOW DIELECTRIC CONSTANT SUBSTRATES

BACKGROUND OF THE INVENTION

The present invention relates to resinous compositions useful as dielectrics and more particularly to the combination of a thermoplastic film and reinforced hollow glass microsphere reinforced laminates for production of thin, low dielectric constant substrates.

A number of polyphenylene ether/polyepoxide compositions have favorable dielectric properties, and supposedly being useful in circuit board manufacture, are known. However, for the most part, these have not attained wide commercial use because of deficiencies in one or more properties. Thus, while the polyphenylene ethers are excellent dielectrics and the properties of combinations thereof with polyepoxides are favorable in this respect, they lack solvent resistance which is required in order for the circuit board to survive cleaning. Other deficiencies are found in areas such as flammability, solderability, and resistance to high temperatures. Moreover, times required for curing such compositions typically are too long for effective manufacture of circuit boards in large volume.

In addition to excellent dielectric properties, resinous compositions to be useful for printed circuit board manufacture should be highly flame-retardant. A V-1 rating, as determined by Underwriters Laboratories Test Procedure UL-94, is universally required with V-0 usually being necessary. The V-0 rating requires a flame-out time (FOT) of not more than 10 seconds in any trial and a cumulative FOT of not more than 50 seconds for 5 samples. As a practical matter, a maximum cumulative FOT of 35 seconds often is mandated by purchasers.

The fabricated board should not lose substantial weight and its surface should not be appreciably marred by contact with methylene chloride, a solvent commonly used for cleaning. Since conductive connections with a printed circuit typically are made by soldering, the board must be solder-resistant as evidenced by the lowest possible percent increase in thickness (Z-axis expansion) when exposed to liquid solder at 288° C. In addition to all these properties of the cured material, a relatively short curing time is highly desirable.

In order to develop thin (less than 0.010 in. thick) laminates, dielectric constants and dissipation factors must be quite low for the laminate core for their use in printed wire board multi-layer constructions in order to minimize capacitance coupling between signal traces and ground planes, to minimize signal propagation impedances and delays, and cross-talk between adjacent signal traces. One method for lowering the dielectric constant and dissipation factor of laminate cores is by the incorporation of hollow glass microspheres (HGM) in the resinous system. For example, U.S. Pat. No. 4,661,301 proposes an HGM filled resin by a vertical extrusion double belt press arrangement. Japanese Publication 62-48710 (Application 60-187-917) proposes a formulation including polyphenylene oxide (PPO) linked resin, an initiator, and between 5 and 50% of silica or HBM. German Pat. No. 3,711,238 proposes fabric plies with 5–40% HGM content in an epoxy/hardener system. U.S. Pat. No. 4,238,641 proposes composite epoxy/HGM systems for hermetic R.F. connectors and coaxial cables. U.S. Pat. No. 4,141,055 proposes UV curable epoxy/HGM systems for cross-over structures. Finally, Haining and Herbaugh, in a 1979 IBM copyrighted article, propose to fill an epoxy resin system with 20–200 micron HGM particles (0.5–2 micron wall thickness) to lower the dielectric constant ($E_r$) from 3.5 to less than 2.

With thin laminates (less than 0.010 in.), HGM filled thermoset formulations (greater than 10% by weight HGM content) tend to be quite brittle. Thus, there is a need to reduce the brittleness of such thin laminates, while providing improved dielectric properties and flame-retardancy.

BROAD STATEMENT OF THE INVENTION

The present invention is directed to a metal-clad electrical laminate which comprises a core of one or more of a polyetherimide or polyphenylene oxide thermoplastic. A pair of intermediate layers of hollow glass microsphere-filled polyphenylene oxide/epoxy is bound to either side of the core. Finally, a pair of metal foil layers are bound to the filled intermediate layers to produce the laminate of the present invention. The laminate desirably has a thickness of less than about 0.010 in., a dielectric constant of about 3 or less, and a HGM content in excess of about 10 wt-%. Additionally, the laminate has a softening point sufficiently high to avoid substantial distortion at processing temperatures of around 200°–235° C.

DETAILED DESCRIPTION OF THE INVENTION

The HGM-reinforced resinous layer is made from a PPO/epoxy formulation. Copending, commonly-assigned application Ser. No. 219,106, filed July 14, 1988, now U.S. Pat. No. 4,853,423, discloses curable polyphenylene ether/polyepoxide compositions incorporating partially cured (upstaged) products prepared from halogen-free bisphenol polyglycidyl ethers, halogen-free epoxidized novolaks, and bisphenols containing bromine as aryl substituents. Copending, commonly-assigned application Ser. No. 288,214, filed Dec. 22, 1988, now U.S. Pat. No. 5,043,367, discloses curable polyphenylene ether/polyepoxide compositions where the polyepoxide composition is based on a monomeric bisphenol polyglycidyl ether having an average of at most one aliphatic hydroxyl group per molecule and containing about 10%–30% bromine as aryl substituents.

The preferred PPO/epoxy resin system for the present invention, however, is disclosed in copending, commonly-assigned application Ser. No. 07/575,925, filed on Aug. 31, 1990. As disclosed therein, the preferred curable composition contains at least about 5% chemically combined bromine and comprises (a) between about 25% and 50% of at least one polyphenylene ether or polyphenylene oxide (PPO); (b) between about 40% and 60% of a combination comprising (i) between about 35% and 45% of a brominated upstaged polyepoxide composition comprising the reaction product of a halogen-free diglycidyl ether of a bisphenol and a bisphenol containing bromine as aryl substituents, and (ii) between about 55% and 65% of a polyepoxide composition comprising at least one bisphenol polyglycidyl ether having an average of at most one aliphatic hydroxyl group per molecule and containing between about 10% and 60% bromine as aryl substituents; (c) up to about 25% of a halogen-free epoxidized novolac; (d) a catalytically-effective amount of a catalyst; and (e) inert solvent.

Referring initially to the polyphenylene ethers useful in formulating the inventive curable composition, polyphenylene ethers comprise a plurality of structural units having the formula

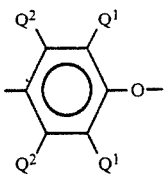 (I)

In each of said units independently, each $Q^1$ is independently halogen, primary or secondary lower alkyl (i.e., alkyl containing up to 7 carbon atoms), phenyl, haloalkyl, aminoalkyl, hydroxycarbonoxy, or halohydrocarbonoxy wherein at least two carbon atoms separate the halogen and oxygen atoms; and each $Q^2$ independently is hydrogen, halogen, primary or secondary lower alkyl, phenyl, haloalkyl, hydrocarbonoxy or halohydrocarbonoxy as defined for $Q^1$. Examples of suitable primary lower alkyl groups are methyl, ethyl, n-propyl, n-butyl, isobutyl-, n-amyl, isoamyl, 2-methylbutyl, n-hexyl, 2,3-dimethylbutyl, 2-, 3- or 4-methylpentyl and the corresponding heptyl groups. Examples of secondary lower alkyl groups are isopropyl, sec-butyl and 3-pentyl. Preferably, any alkyl radicals are straight chain rather than branched. Most often, each $Q^1$ is alkyl or phenyl, especially $C_{1-4}$ alkyl, and each $Q^2$ is hydrogen.

Both homopolymer and copolymer polyphenylene ethers are included. Suitable homopolymers are those containing, for example, 2,6-dimethyl-1,4-phenylene ether units. Suitable copolymers include random copolymers containing such units in combination with (for example) 2,3,6-trimethyl-1, 4-phenylene ether units. Many suitable random copolymers, as well as homopolymers, are disclosed in the patent literature.

Also included are polyphenylene ethers containing moieties which modify properties such as molecular weight, melt viscosity, and/or impact strength. Such polymers are described in the patent literature and may be prepared by grafting onto the polyphenylene ether in known manner such non-hydroxy-containing vinyl monomers as acrylonitrile and vinylaromatic compounds (e.g., styrene), or such non-hydroxy-containing polymers as polystyrenes and elastomers. The product typically contains both grafted and ungrafted moieties. Other suitable polymers are the coupled polyphenylene ethers in which the coupling agent is reacted in known manner with the hydroxy groups of two polyphenylene ether chains to produce a higher molecular weight polymer containing the reaction product of the hydroxy groups and the coupling agent. Illustrative coupling agents are low molecular weight polycarbonates, quinones, hetercycles, and formals.

For the purposes of this invention, the polyphenylene ether has a number average molecular weight within the range of about 3,000-40,000, preferably at least about 12,000 and most preferably at least about 15,000, and a weight average molecular weight within the range of about 20,000-80,000, as determined by gel permeation chromatography. Its intrinsic viscosity is most often in the range of about 0.15-0.16 dl./g, as measured in chloroform at 25° C.

The polyphenylene ethers are typically prepared by the known oxidative coupling of at least one corresponding monohydroxyaromatic compound. Particularly useful and readily available monohydroxyaromatic compounds are 2,6-xylenol (wherein each $Q^1$ is methyl and each $Q^2$ is hydrogen), whereupon the polymer may be characterized as a poly(2,6-dimethyl-1, 4-phenylene ether), and 2,3,6-trimethylphenol (wherein each $Q^1$ and one $Q^2$ are methyl and the other $Q^2$ is hydrogen).

Particularly useful polyphenylene ethers for the purposes of this invention are those which comprise molecules having aminoalkyl-substituted end groups, as described in numerous patents and publications. Such molecules frequently constitute a substantial proportion of the polyphenylene ether, typically as much as about 90% by weight. Polymers of this type may be obtained by incorporating an appropriate primary or secondary monoamine as one of the constituents of the oxidative coupling reaction mixture.

It will be apparent to those skilled in the art from the foregoing description that the polyphenylene ethers contemplated for use in the present invention include all those presently known, irrespective of variations in structural units or ancillary chemical features.

The brominated upstaged polyepoxide composition, component (i), is prepared by the reaction of two or three reagents of which one is at least a halogen-free bisphenol polyglycidyl ether. The most common compounds of this type are prepared by the reaction of bisphenols with epichlorohydrin. (By "bisphenol" as used herein is meant a compound containing two hydroxyphenyl groups attached to an aliphatic or cycloaliphatic moiety, which may also contain aromatic substituents.) Said compounds may be represented by the formula:

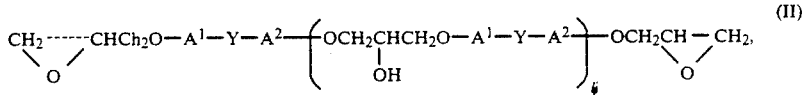 (II)

wherein n has an average value up to 1, each of $A^1$ and $A^2$ is a monocyclic divalent aromatic radical and Y is a bridging radical in which one or two atoms separate $A^1$ from $A^2$ in relation to Y.

In formula II, the $A^1$ and $A^2$ values may be unsubstituted phenylene or substituted derivatives thereof, illustrative substituents (one or more) being alkyl, nitro, alkoxy and the like. Unsubstituted phenylene radicals are preferred. Each of $A^1$ and $A^2$ may, for example, be o- or m-phenylene and the other p-phenylene, but both preferably are p-phenylene.

The bridging radical, Y, is one in which one or two atoms, preferably one, separate $A^1$ from $A^2$. It is most often a hydrocarbon radical and particularly a saturated radical such as methylene, cyclohexylmethylene, ethylene, isopropylidene, neopentylidene, cyclohexylidene, or cyclopentadecylidene, especially a gem-alkylene (alkylidene) radical and most preferably isopropylidene. Also included, however, are radicals which contain atoms other than carbon and hydrogen; for example, carbonyl, oxy, thio, sulfoxy, and sulfone.

The materials which are preferred are commercially available reaction products of epichlorohydrin and 2,2-bis(4-hydroxyphenyl)propane (bisphenol A), including EPON 825 (n=0) and EPON 828 (n=about 0.14), available from Shell Chemical Co.

The second reagent is at least one bisphenol containing bromine in the form of substituents of the aromatic rings, usually a brominated derivative of bisphenol A. Its purpose according to the invention is principally to provide flame retardancy. 2,2-bis(3,5-dibromo-4-hydroxyphenyl)propane is preferred as this reagent because of its availability, relatively low cost and particular suitability for the purposes of the invention.

Component (II) is a polyepoxide composition comprising at least one bisphenol polyglycidyl ether. It usually comprises a mixture of such ethers, part of the components of said mixture being halogen-free and the balance thereof containing bromine as aryl substituents. The total amount of bromine therein is about 10%–60% by weight.

Compounds of this type are prepared conventionally by the reaction of bisphenols with epichlorohydrin. (By "bisphenol" as used herein is meant a compound containing two hydroxyl groups attached to an aliphatic or cycloaliphatic moiety, such may also contain aromatic substituents.) Said compounds may be represented by the formula:

phenol A. The principal purpose of the brominated compounds is to provide flame retardancy.

Component ii preferably is blended with component i for formulating the polyepoxide portion (b) of the curable composition. Alternatively, however, component ii can be incorporated with a halogen-free diglycidyl ether of a bisphenol and the brominated bisphenol components, and the three components reacted to produce a low molecular weight, high bromine content moeity.

The reaction mixture comprising the reagents forming component (i) and optionally component (ii) is heated, most often at a temperature in the range of about 120°–225° C., preferably about 140°–200° C., and most preferably about 160°–100° C., in the presence of a catalytic amount of at least one basic reagent. Said mixture preferably consists essentially of said reagents; that is, they are the only ones contributing to the novel and essential properties thereof.

The triarylphosphines, especially triphenylphosphine, are the preferred basic reagents by reason of their effectiveness at low levels, low tendency to cause side reaction, and neutrality when they remain present after the reaction is complete. The proportion of catalyst is typically about 0.1%–0.5% by weight. The reaction is preferably conducted in an inert atmosphere such as nitrogen, especially when a triarylphosphine is employed as the catalyst. An inert organic solvent having a boiling point no higher than about 125° C., usually an aromatic hydrocarbon such as toluene, may be em-

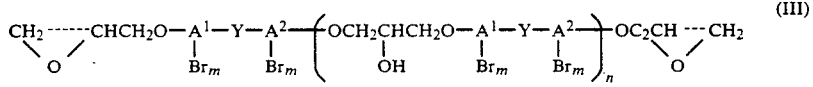
(III)

wherein m is 0–4, n has an average value up to 1, each of $A^1$ and $A^2$ is a monocyclic divalent aromatic radical, and Y is a bridging radical in which one or two atoms separate $A^1$ from $A^2$ in relation to Y.

In formula III, the $A^1$ and $A^2$ values may be unsubstituted phenylene or substituted derivatives thereof, illustrative substituents (one or more) being alkyl, nitro, alkoxy and the like. Unsubstituted phenylene radicals are preferred. Each of $A^1$ and $A^2$ may, for example, be o- or m-phenylene and the other p-phenylene, but both are preferably p-phenylene.

The bridging radical, Y, is one in which one or two atoms, preferably one, separate $A^1$ and $A^2$. It is most often a hydrocarbon radical and particularly a saturated radical such as methylene, cyclohexylmethylene, ethylene, isopropylidene, neopentylidene, cyclohexylidene, or cyclopentadecylidene, especially a gem-alkylene (alkylidene) radical and most preferably isopropylidene. Also included, however, are radicals which contain atoms other than carbon and hydrogen; for example, carbonyl, oxy, thio, sulfoxy, and sulfone.

In most instances, component ii comprises at least two bisphenol polyglycidyl ethers, one being brominated (m is 1–4, preferably 2) and the other bromine-free (m is 0). The proportions thereof are based on the required bromine content for component ii of about 10%–60%. The preferred materials are commercially available reaction products of epichlorohydrin and 2,2-bis(4-hydroxyphenyl)propane (bisphenol A), including EPON 825 (n=0) and EPON 828 (n=about 0.14), available from Shell Chemical Co., and similar products prepared from epichlorohydrin and tetrabromobisployed but usually provides no advantage at this point.

The structure of the resinous compositions thus obtained is not fully known. It is believed to be an "upstaged" (i.e., partially cured) composition derived from the compounds of formula III, in which the brominated moieties form part of the molecular structure.

Optional reagent (c) is at least one halogen-free epoxidized novolak. Suitable novolaks for use as precursors therefor are known in the art and typically are prepared by the reaction of formaldehyde with a hydroxyaromatic compound such as phenol (which is often preferred), cresol, or t-butylphenol. The novolak then undergoes reaction with an epoxy reagent such as epichlorohydrin to produce the resin useful as reagent (c).

Various epoxidized novolaks are commercially available, and any of them may be used according to the invention. It is usually strongly preferred that the epoxidized novolak contains substantially no free phenolic hydrogen atoms.

Component (d) is any catalyst effective as a curing agent for epoxy resins, e.g. imidazoles and arylene polyamines. Particularly useful imidazoles are imidazole, 1-methylimidazole, 1,2-dimethylimidazole, 2-methylimidazole, 2-heptadecylimidazole, 2-ethyl-4-methylimidazole, 2-undecylimidazole, and 1-(2-cyanoethyl-2-phenylimidazole. Representative useful arylene polyamines include, for example, diethyltoluenediamine, tris(dimethylaminomethyl)phenol, and 3-phenyl-1,1-dimethyl urea. Commercially available imidazolearylene polyamine mixtures can be used; the especially preferred mixtures contain arylene polyamines with a high degree of alkyl substitution on the aromatic ring, typically at least three such substituents. The diethylmethyl-substituted m- and p-phenylenediamines are generally the most preferred polyamines.

Unexpectedly, silane coupling agents added to improve wetting out of the fabric reinforcement displayed effective catalytic behavior in the curable formulation. Silanes evaluated include 3-(2-aminoethyl)-aminopropyl trimethoxysilane, gamma-aminopropyl triethoxysilane, and glycidoxypropyl trimethoxysilane. The amine-containing silanes proved more effective. Silanes can be used as co-catalysts or can be the primary catalyst, as the data reveals.

The amount of component (d) is a catalytically effective amount to achieve curing, preferably rapidly after solvent removal. Most often, it is at least 4.5 and preferably at least 10 milliequivalents of basic nitrogen per 100 parts of total curable composition, including any basic nitrogen present in the polyphenylene ether (mostly as aminoalkyl-substituted end groups). Thus, when a polyphenylene ether essentially free from basic nitrogen is employed, the proportion of component (d) must be increased. (For the purposes of this invention, the equivalent weight of an imidazole is its molecular weight and that of a diamine is half its molecular weight.)

Co-catalysts and activators desirably also are used for achieving advantageous cure rates of the inventive curable compositions. Salts of diketones in which one carbon atom separates the carbonyl groups, especially acetylacetonates, and salts of fatty acids, especially stearates and octoates, are examples of suitable forms of zinc, magnesium, or aluminum for this purpose. Specific examples include zinc acetylacetonate, zinc stearate, magnesium stearate, aluminum acetyl acetonate, zinc octoate, zinc neodecanoate, and zinc naphthenate. In general, the fatty acid salts are preferred when component (d) contains alkylene polyamides, and diketone salts are preferred when component (d) is entirely imidazole. Additional secondary catalysts include, for example, maleic anhydride and BF$_3$-ethylamine complex.

Under certain conditions, acetylacetonates such as zinc acetylacetonate can form hydrates which readily lose acetylacetone and become insoluble in the organic systems used for laminate preparation. Therefore, it may be necessary to take steps to maintain the zinc or aluminum in stable dispersion. One means for doing this is to subject the composition to continuous agitation; however, that is generally not practical. A better method is to form an alcoholate of the acetylacetonate, as by reaction with methanol. The alcoholate loses alcohol rather than acetylacetone under similar conditions, remaining in solution or homogeneous suspension.

Another method for maximizing homogeneity is to employ is to employ a fatty acid salt. Still another method is to employ a titanium compound as a compatibilizer, as disclosed hereinafter.

Co-catalysts are employed in a cocatalytically effective amount, and generally also serves to improve solvent resistance and flame retardancy. About 0.1%-1.5% of zinc, magnesium, or aluminum, based on total curable composition, is usually present.

Various other materials may be employed in the curable compositions of this invention; the presence of certain of them usually is preferred. One of these is (c) at least one epoxidized novolak, most often halogen-free. It is usually employed in the amount of about 5-10 parts by weight per 100 parts of total components (a) and (b).

Among the other materials which may be present are inert, particulate fillers such as talc, clay, mica, silica, alumina, and calcium carbonate. In addition, the bromine content of the curable composition may be supplied in part by materials such as alkyl tetrabromophthalates and/or epichlorohydrin reaction products with mixtures of bisphenol A and tetrabrombisphenol A. The alkyl tetrabromophthalates also serve as plasticizers and flow improvers. Fabric wettability enhancers (e.g. wetting agents and coupling agents) and polar liquids such as n-butyl alcohol, methyl ethyl ketone, polysiloxanes, and tetrahydrofuran, may be advantageous under certain conditions. Such materials as antioxidants, thermal and ultraviolet stabilizers, lubricants, antistatic agents, dyes, and pigments may also be present.

An important feature of the invention is the fact that flame retardancy synergists, such as antimony pentoxide, generally are not necessary. However, they may be incorporated when appropriate.

When antimony pentoxide is employed, it must be maintained in stable dispersion. This may be done by agitation and/or combination with a suitable dispersing agent, of which many are known in the art. The proportion of antimony pentoxide is usually up to about 4 parts per 100 parts of components (a)-(d).

One preferred dispersing agent is a polymer which is compatible with the resinous constituents of the curable composition but is substantially non-reactive under the conditions employed, typically a polyester. More powerful dispersing agents, such as amines, may be required when the zinc or aluminum salt is a fatty acid, salt, since such salts may otherwise form insoluble complexes with antimony pentoxide.

A material whose presence in minor amount may improve the solvent resistance and compatibility of the curable composition, and is therefore preferred, is at least one aliphatic tris(dialkylphosphato)titanate. Suitable phosphatotitanates are known in the art and commercially available. They may be represented by the formula;

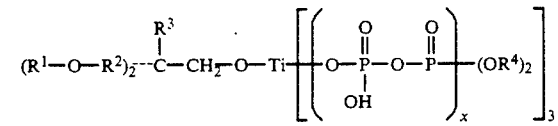

wherein $R^1$ is $C_{2-6}$ primary or secondary alkyl or alkenyl and preferably alkenyl; $R^2$ is $C_{1-3}$ alkylene and preferably methylene; $R^3$ is $C_{1-5}$ primary or secondary alkyl; and x is from 0 to about 3 and is preferably 0 or 1. Most preferably, $R^1$ is alkyl, $R^3$ is ethyl, $R^4$ is octyl, and x is 0. The phosphatotitanate is most often present in the amount of about 0.1-1.0 part by weight per 100 parts of the resinous composition.

The present invention includes all compositions which comprise the above-described constituents, including those containing other unspecified ingredients. However, the compositions which are often preferred consist essentially of components (a)-(d); that is, said components are the only ones which materially affect the basic and novel characteristics of the compositions.

The HGM preferably have a diameter ranging from about 20-150 microns with a glass wall thickness ranging from about 0.5-2 microns. Preferably greater than 10 wt-% HGM content in the PPO/epoxy system is used with the HGM content ranging on up to about 50 wt-% or greater. The blending of the HGM in the resin system should be by low shear mixing in order to avoid rupture of a significant fraction of the HGM content. The difference in density often causes the HGM to separate, thus use of the filled system promptly or inclusion of fumed silica or another agent to retard settling of the HGM should be practiced in conventional fashion as is necessary, desirable, or convenient.

The polyetherimides can be obtained by any of the methods well known to those skilled in the art including the reaction of any aromatic bis(ether anhydrides) of the formula:

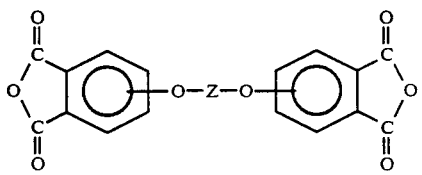

where Z is defined below, with an organic diamine of the formula:

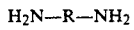

where R also will be defined below.

Aromatic bis(ether anhydride)s of the above formula include, for example 2,2-bis(2,3-dicrboxyphenoxy)-phenyl-propane dianhydride; 4,4'-bis(2,3-dicarboxyphenoxy)diphenyl ether dianhydride; 1,3-bis(2,3-dicarboxyphenoxy)benzene dianhydride; 4,4'-bis(2,3-dicarboxyphenoxy)diphenyl sulfide dianhydride, 1,4-bis(2,3-dicarboxyphenoxy)benzene dianhydride; 4,4'-bis(2,3-dicarboxyphenoxy)benzophenone dianhydride; 4,4'-bis(2,3-dicarboxyphenoxy)diphenyl sulfone dianhydride; 2,2-bis[4-(3,4-dicarboxyphenoxy)phenyl]propane dianhydride; 4,4'-bis(3,4-dicarboxy)diphenyl ether dianhydride; 4,4'-bis(3,4-dicarboxy)diphenyl sulfide dianhydride; 1,4-bis(3,4-dicarboxyphenoxy)benzene dianhydride; 1,4-bis(3,4-dicarboxyphenoxy)benzene dianhydride; 4,4'-bis(3,4-dicarboxyphenoxy benzophenone dianhydride; 4-(2,3-dicarboxyphenoxy)-4'(3,4-dicarboxyphenoxy)diphenyl-2,2-propane dianhydride; and mixtures of such dianhydrides.

In addition, aromatic bis(ether anhydride)s also included by the above formula are shown by Koton, M. M.; Florinski, F. S.; Bessonov, M. I.; Rudakov, A. P. (Institute of Heteroorganic compounds, Academy of Sciences, U.S.S.R.), U.S.S.R. 257,010, Nov. 11, 1969, Appl. May 3, 1967. In addition, dianhydrides are shown by M. M. Koton, F. S. Florinski, Zh Org. Khin, 4(5), 774 (1968).

Organic diamines of the above formula include, for example, m-phenylenediamine, p-phenylenediamine, 4,4'-diaminodiphenyl sulfide, 4,4'-diaminodiphenyl sulfone, 4,4'-diaminodiphenyl ether, 1,5 diaminonaphthalene, 3,3'-dimethylbenzidine, 3,3'-dimethoxybenzidine, 2,4-bis($\beta$ amino-t-butyl)toluene, bis(p-$\beta$-amino-t-butylphenyl)ether, bis(p-$\beta$-methyl-o-aminopentyl)benzene, 1,3-diamino-4-isopropylbenzene, 1,2-bis(3-aminopropoxy)ethane, m-xylylenediamine, p-xylylenediamine, 2,4-diaminotoluene, 2,6-diaminotoluene, bis(4-aminocyclohexyl)methane, 3-methylheptamethylenediamine, 4,4-dimethylheptamethylenediamine, 2,11-dodecanediamine, 2,2-dimethylopropylenediamine, octamethylenediamine, 3-methoxyhexamethylenediamine, 2,5-dimethylhexamethylenediamine, 2,5-dimethylheptamethylenediamine, 3-methylheptamethylenediamine, 5-methylnonamethylenedediamine, 1,4-cyclohexanediamine, 1,12-octadecanediamine, bis(3-aminopropyl)sulfide, N-methyl-bis(3-aminopropyl)amine, hexamethylenediamine, heptamethylenediamine, nonamethylenediamine, decamethylenediamine, bis(3-aminopropyl) tetramethyldisiloxane, bis(4-aminobutyl) tetramethyldisiloxane, and the like.

In general, the reactions can be advantageously carried out employing well known solvents, e.g. o-dichlorobenzene, m-cresol/dianhydrides and the diamines, at temperatures of from about 100° to about 250° C. Alternatively, the polyetherimides can be prepared by melt polymerization of any of the above dianhydrides with any of the above diamine compounds while heating the mixture of the ingredients at elevated temperatures with concurrent intermixing. Generally, melt polymerization temperatures between about 200° to 400° C. and preferably 230° to 300° C. can be employed. The conditions of the reaction and the proportions of ingredients can be varied widely depending on the desired molecular weight, intrinsic viscosity, and solvent resistance. In general, equimolar amounts of diamine and dianhydride are employed for high molecular weight polyetherimides, however, in certain instances, a slight molar excess (about 1 to 5 mol percent) of diamine can be employed resulting in the production of polyetherimides having terminal amine groups. Generally, useful polyetherimides have an intrinsic viscosity greater than 0.2 deciliters per gram, preferably 0.35 to 0.60 or 0.7 deciliters per gram or even higher than measured in m-cresol at 25° C.

Included among the many methods of making the polyetherimides are those disclosed in U.S. Pat. Nos. 3,847,867, Heath, et al., 3,846,869, Williams, 3,850,885, Takekoshi, et al., 3,852,242, White, and 3,855,178, etc. These disclosures are incorporated herein in their entirety by reference for the purpose of teaching, by way of illustration, general and specific methods for preparing polyetherimides suitable for the composites of this invention.

The polyetherimides themselves can be represented by the following formula:

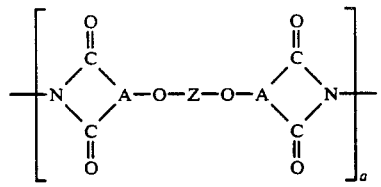

where a represents a whole number in excess of 1, e.g., 10 to 10,000 or more, the group is selected from:

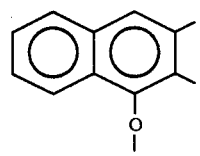

-continued

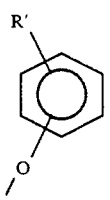

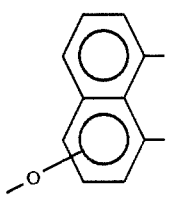

R' being hydrogen, lower alkyl or lower alkoxy, preferably the polyetherimide includes the latter

group where R' is hydrogen such that the polyetherimide is of the formula:

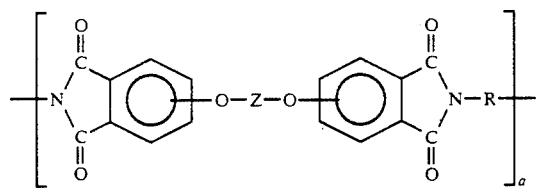

and the divalent bonds of the —O—Z—O radical are in the 3,3'; 3,4'; 4,3' or the 4,4' position; and Z is a member of the class consisting of (1)

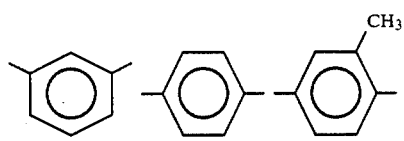

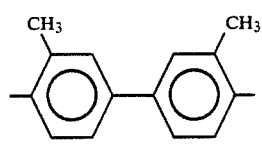

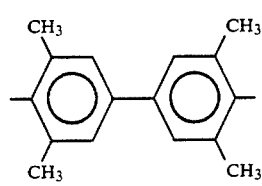

-continued

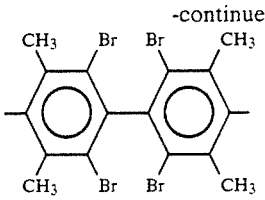

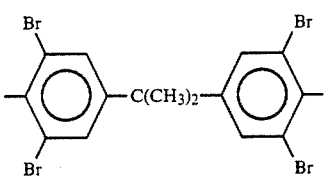

and (2) divalent organic radicals of the general formula:

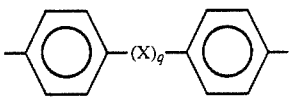

where X is a member selected from the class consisting of divalent radicals of the formulas,

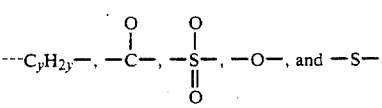

where Q is 0 or 1, y is a whole number from 1 to 5, and R is a divalent organic radical selected from the class consisting of (1) aromatic hydrocarbon radicals having from 6-20 carbon atoms and halogenated derivatives thereof, (2) alkylene radicals and cycloalkylene radicals having from 2-20 carbon atoms, $C_{(2-8)}$ alkylene terminated polydiorganosiloxane, and (3) divalent radicals includes the formula

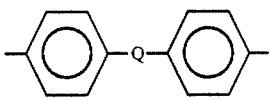

where Q is a member selected from the class consisting of

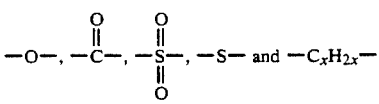

where x is a whole number from 1 to 5 inclusive. Particularly preferred polyetherimides for the purposes of the present invention include those where

and Z respectively are:

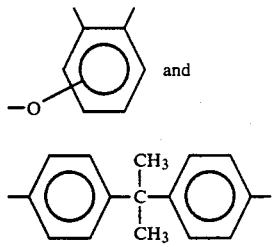

and R is selected from:

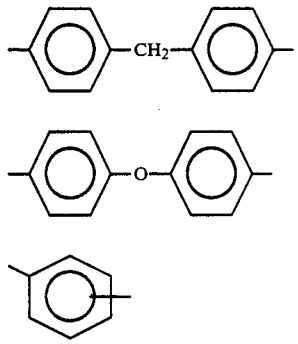

The polyetherimides where R is a metaphenylene are most preferred.

The polyetherimide resins may be admixed with a variety of other resins for achieving certain specific effects, if necessary, desirable, or convenient. The additional resins include, for example, polyamide resins, rubber modified vinyl aromatic polymers, organopolysiloxane-polycarbonate block copolymers, and the like.

The PPO/epoxy formulation filled with HGM is coated onto one side of metal foil (preferably copper foil) in conventional fashion at a thickness ranging from about 2 to 5 mils and the solvent evaporated and the resin B-staged. Thereafter, the core of polyetherimide or PPO is formed into a laminate structure in conventional fashion utilizing temperatures ranging from about 180° to 250° C. and pressures of about 100 to 600 psi for times ranging from about 2 to 20 minutes. As noted above, thin, e.g. less than 0.010 inch thick) laminate structures of reduced brittleness result. Moreover, excellent adhesive compatibility with the PPO/epoxy formulation and the polyetherimide or PPO is provided. Additionally, a flame-retardant filled formulation is included in a laminate structure.

It should be noted that the HGM-filled PPO/epoxy formulation or other resin additionally can be impregnated into a fibrous substrate (woven or non-woven) such as glass, quartz, polyester (including liquid crystal form), polyamide, polypropylene, cellulose, nylon or acrylic fibers, and preferably glass. Such fibrous structure would then be sandwiched between two such structures as described above.

Laminates clad with a conductive metal such as copper, useful for printed circuit board production, may be so prepared and cured by art-recognized methods. As previously mentioned, printed circuit board blanks comprising said laminates are characterized by excellent dielectric properties, solderability, flame retardancy, and resistance to high temperature conditions and solvents. The metal cladding then may be conventionally patterned.

The following examples shows how the present invention has been practiced but should not be construed as limiting. In this application, all percentages and parts are by weight and all units are in the metric system, unless otherwise expressly indicated. Also, all citations referred to herein are expressly incorporated herein by reference.

EXAMPLE 1

PPO (poly)2,6-dimethyl-1,4-phenylene ether), having a number average molecular weight of about 20,000, an intrinsic viscosity in chloroform at 25° C. of 0.40 dl/g and a nitrogen content of about 960 ppm (1970 g) was equilibrated in DER 542 brominated epoxy monomer (48.8% bromine content), 328 epoxide equivalent weight, Dow Chemical Company (1637 g), toluene solvent (3821 g), and benzoyl peroxide initiator (79 g) and bisphenol A (79 g) chain terminator at 90° for 90 minutes. Upon cooling, toluene (3495 g), component 270-75 (75% solids in toluene, 1424 g), reaction product of Epon 828 diglycidyl ether of bisphenol A (epoxide equivalent weight 185-192, Shell Chemical Company), and tetrabromobisphenol A (3.5:1.0 molar ratio), reactions initiated at 120° C. using triphenylphosphine catalyst in toluene solvent), Cabosil M-5 calcined fumed silica (300 g, surface area 200 m²/g, Cabot Corp.), zinc octoate (300 g, THERM-CHECK T-705, 80% active zinc octoate in mineral spirits, Ferro Corp.), and A-1100 (30 g, gamma-aminopropyltriethoxysilane, Union Carbide Corp.) were added at room temperature. Hollow glass microspheres (type SI, W. R. Grace), then were homogeneously mixed with the above varnish in a low shear blender to avoid excessive breakage of the microspheres. The concentration of HGM was about 20% by weight of the resin solids. The solids content of the final formulation was 50-53% by weight.

Two sheets of 1 oz. JTC copper foil (Gould, Inc.) were coated with 4-6 mil thick films of the foregoing HGM reinforced PPO/epoxy resin. The coated copper was passed through two heating zones to evaporate the solvent and B-stage with the first zone kept at 120° C. and the second zone at 160° C. with dwell times of approximately 3-4 minutes in each zone. The coated copper foils then were bonded to both sides of either 1 mil Ultem 5001 brand polyetherimide, 2 mil Ultem film (GE Plastics Structured Products Division), 2-3 mil PPO film (0.387 IV, GE Plastics), or a 2 mil TPX 50X-44B polymethylpentene film (supplied by Mitsui Petrochemical, Inc.). Dwell times at temperature and pressure indicated in the following table were 5-7 minutes followed by cooling to less than 350° F. under pressure. The following results were recorded.

TABLE 1

| Thermoplastic Film Reinforced HGM PPO/Epoxy Laminate | | | | |
|---|---|---|---|---|
| Core Materials | 1 mil Ultem | 2 mil Ultem | 2 mil PPO | 2 mil TPX |
| Lamination: | | | | |
| Temperature, °C. | 240 | 240 | 230 | 240 |
| Pressure, psi | 550 | 550 | 350 | 350 |
| Etched Thickness (in) | .004" | .004–0.005 | .005–.006 | — |
| Film Core Dielectric Constant | 3.15 | 3.15 | 2.56 | 2.1 |
| Adhesion Compatibility | Good | Good | Fair | Poor |
| Resistance to | Fair | Good | Fair | — |

TABLE 3

| Formulations for Copper Coating (wt %) | 1 | 2 | 3 | 4 | 5 | 6 |
|---|---|---|---|---|---|---|
| PPO/Epoxy Resin | 90 | 90 | 85 | 85 | 80 | 80 |
| Type SI HGM | 10 | — | 15 | — | 20 | — |
| Type FTD HGM | — | 10 | — | 15 | — | 20 |
| Results* | | | | | | |
| DC Without Core Reinforcement | 2.77 | 2.92 | — | — | 2.17 | 2.67 |
| DF Without Core Reinforcement | 0.026 | 0.070 | — | — | 0.024 | 0.063 |
| DC With 1 T416540X Core Ply | — | — | 2.64 | 3.25 | 2.57 | 3.10 |
| DF With 1 T416540X Core Ply | — | — | 0.026 | 0.082 | 0.025 | 0.094 |
| DC With 1 T017550X Core Ply | 2.65 | — | 2.49 | — | 2.44 | — |
| DF With 1 T017550X Core Ply | 0.020 | — | 0.020 | — | 0.013 | — |

*DC is dielectric constant tested as received
DF is dissipation factor tested as received

TABLE 1-continued

Thermoplastic Film Reinforced HGM PPO/Epoxy Laminate

| Core Materials | 1 mil Ultem | 2 mil Ultem | 2 mil PPO | 2 mil TPX |
|---|---|---|---|---|
| Breakage (Etched Film) | | | | |
| Dielectric Thickness (in)* | 0.0043 | 0.0054 | 0.0059 | — |
| Dielectric Constant* | 3.00 | 3.05 | 2.83 | — |
| Dissipation Factor* | 0.015 | 0.014 | 0.010 | — |

*1 MHz at Room Temperature, 1PC-L-112 Test Method

The foregoing results of this lamination indicate that the Ultem and PPO films provided the best adhesion compatibility, whereas the TPX film blistered upon lamination. Examination of the films after etching the copper also indicated that the handleability of the films were substantially upgraded. The final substrate thicknesses were about 4-6 mils. Accordingly, the laminates were quite thin while maintaining somewhat low dielectric constants and dissipation factors, while having the brittleness reduced by virtue of the core thermoplastic layer. Adhesion compatibility also was demonstrated in these data.

EXAMPLE 2

In this example, two different types of hollow glass microspheres, type SI and FTD-202 (W. R. Grace), were evaluated in the PPO/epoxy resin formulation (see Example 1) with two different cores, T017550X and T416540X GETEK impregnated glass cloth prepregs (General Electric Company, Coshocton, Ohio), as described below:

TABLE 2

| | T017550X | T416540X |
|---|---|---|
| Resin Type | GETEK | GETEK |
| Glass Cloth Type | 106 | 1080 |
| wt % Resin | 70-79 | 62-68 |
| % Squeeze Out (IPC-TM-650) | 40-57 | 36-44 |
| Appox. Pressed Thickness | 1.3-2.0 mils | 2.1-3.0 mils |
| U.L. Description | TO## | T4## |

The HGM-filled resin formulation was coated on the backside of 1 oz. JTC copper foil (Gould, Inc.) using a horizontal copper treater with the use of a doctor's blade. The copper treater had two heating zones to evaporate solvents and B-stage the mix, respectively. The temperature of the first zone was maintained at 120° C. and the second zone at 160° C. (dwell times were about 3-4 minutes in each zone).

Thin laminates were produced by pressing two 12"×12" coated copper foils together between two preheated steel pans at 240° C. for 5 minutes at 500 psi pressure. Pressed laminates were cooled to 200° C. under pressure before opening the press. Copper clad thin laminates then were etched to determine the dielectric constant properties, as set forth below.

The above-tabulated results indicate that thicker glass cloth, T416540X, shows higher a dielectric constant for the same configuration as compared to the thinner cloth. Comparison of the two different types of hollow glass microspheres indicate that the type SI provides lower values of DC and DF compared to type FTD-202.

We claim:

1. A metal-clad electrical laminate comprising a core of one or more of polyetherimide thermoplastic, polyphenylene oxide thermoplastic, or resin-filled fibrous substrate, a pair of intermediate layers of hollow glass microsphere-filled polyphenylene oxide/epoxy bound to said core, and a pair of metal foil layers bound to said filled intermediate layers.

2. The laminate of claim 1 wherein said metal foil layers comprise copper.

3. The laminate of claim 1 wherein said hollow glass microspheres have a diameter ranging from about 20 to 150 microns.

4. The laminate of claim 1 which contains greater than about 10% by weight of said hollow glass microspheres.

5. The laminate of claim 4 wherein the proportion of hollow glass microspheres ranges from about 10% to about 50% by weight.

6. The laminate of claim 1 wherein said polyphenylene oxide/epoxy comprises (a) between about 25% and 50% of at least one polyphenylene ether or polyphenylene oxide (PPO); (b) between about 40% and 60% of a combination comprising (i) between about 35% and 45% of a brominated upstaged polyepoxide composition comprising the reaction product of a halogen-free diglycidyl ether of a bisphenol and a bisphenol containing bromine as aryl substituents, and (ii) between about 55% and 65% of a polyepoxide composition comprising at least one bisphenol polyglycidyl ether having an average of at most one aliphatic hydroxyl group per molecule and containing between about 10% and 60% bromine as aryl substituents; (c) up to about 25% of a halogen-free epoxidized novolac; (d) a catalytically-effective amount of a catalyst; and (e) inert solvent.

7. The laminate of claim 1 which has a thickness of less than about 0.25 mm.

8. The laminate of claim 1 wherein said core comprises polyetherimide thermoplastic.

9. The laminate of claim 1 wherein said core comprises polyphenylene oxide thermoplastic.

10. The laminate of claim 1 wherein said polyphenylene oxide/epoxy comprises between about 25% and 70% of at least one polyphenylene ether or polyphenylene oxide and between about 30% and 75% of a brominated epoxy.

11. The laminate of claim 1 wherein said fibrous substrate is one or more of glass, quartz, polyester, polyamide, polypropylene, cellulose, nylon, or acrylic.

12. The laminate of claim 11 wherein said resin comprises a polyphenylene oxide/epoxy resin.

13. The laminate of claim 11 wherein said resin comprises a polyester resin.

14. The laminate of claim 13 wherein said polyester resin comprises a liquid crystal polyester resin.

* * * * *